United States Patent [19]

Mathews et al.

[11] Patent Number: 5,481,697
[45] Date of Patent: Jan. 2, 1996

[54] AN APPARATUS FOR PROVIDING A CLOCK SIGNAL FOR A MICROPROCESSOR AT A SELECTABLE ONE OF A PLURALITY OF FREQUENCIES AND FOR DYNAMICALLY SWITCHING BETWEEN ANY OF SAID PLURALITY OF FREQUENCIES

[75] Inventors: Gregory Mathews, Cupertino; Edward Zager, San Jose; Sundari Mitra, Milpitas, all of Calif.

[73] Assignee: Intel Corporation, Santa Clara, Calif.

[21] Appl. No.: 315,688

[22] Filed: Sep. 30, 1994

Related U.S. Application Data

[63] Continuation of Ser. No. 121,028, Sep. 14, 1993, abandoned, which is a continuation of Ser. No. 595,962, Oct. 12, 1990, abandoned.

[51] Int. Cl.⁶ ............................... G06F 1/06; G06F 1/08
[52] U.S. Cl. ............... 395/550; 364/270.2; 364/DIG. 1; 364/270.4; 364/270.3
[58] Field of Search ........................ 364/200, 900; 395/550; 328/72, 132, 133

[56] References Cited

U.S. PATENT DOCUMENTS

| | | | |
|---|---|---|---|
| 4,079,456 | 3/1978 | Lunsford et al. | 395/550 |
| 4,322,580 | 3/1982 | Khan | 395/550 |
| 4,549,094 | 10/1985 | Floyd | 328/164 |
| 4,641,044 | 2/1987 | Shiraishi | 307/269 |
| 4,819,164 | 4/1989 | Branson | 395/550 |
| 4,823,262 | 4/1989 | Calle | 395/550 |
| 4,855,616 | 8/1989 | Wang | 328/72 |
| 4,893,271 | 1/1990 | Davis et al. | 395/550 |
| 4,965,524 | 10/1990 | Patchen | 328/72 |
| 5,036,528 | 7/1991 | Costantino et al. | 328/133 |
| 5,077,686 | 12/1991 | Rubinstein | 395/550 |
| 5,086,387 | 2/1992 | Arroyo et al. | 364/DIG. 1 |
| 5,087,829 | 2/1992 | Ishibashi et al. | 307/269 |
| 5,139,064 | 7/1992 | Hotta et al. | 395/550 |
| 5,261,082 | 11/1993 | Ito et al. | 395/550 |
| 5,319,771 | 6/1994 | Takeda | 395/550 |

FOREIGN PATENT DOCUMENTS 2228598 of 1990 United Kingdom.

OTHER PUBLICATIONS

Harris, 82C85 Data Sheet.
Compaq DESKPRO 386/20 Technical Reference Guide (excerpt).

*Primary Examiner*—Christopher B. Shin
*Attorney, Agent, or Firm*—Blakely, Sokoloff, Taylor & Zafman

[57] ABSTRACT

A variable frequency clock generator provides complementary phase clock signals for a microprocessor at a selectable one of a plurality of frequencies. The outputs may be dynamically switched between any of the frequencies so that every cycle of the phase clock signals has a duration at least as great as the cycle duration of the highest frequency.

5 Claims, 6 Drawing Sheets

AN APPARATUS FOR PROVIDING A CLOCK SIGNAL FOR A MICROPROCESSOR AT A SELECTABLE ONE OF A PLURALITY OF FREQUENCIES AND FOR DYNAMICALLY SWITCHING BETWEEN ANY OF SAID PLURALITY OF FREQUENCIES

This is a continuation of application Ser. No. 08/121,028 filed Sep. 14, 1993, abandoned, which is a continuation of application Ser. No. 07/595,962 filed Oct. 12, 1990, abandoned.

FIELD OF THE INVENTION

This invention relates to microprocessor systems, and particularly to a clock control circuit for providing a variable frequency clock signal to a microprocessor.

BACKGROUND OF THE INVENTION

Various methods and circuits are used for microprocessor-based systems to provide a clock signal whose frequency may be varied to accommodate system constraints. For example, if the microprocessor must communicate with relatively slow speed peripheral devices, it is desirable to reduce the frequency of the clock signal provided to the microprocessor to accommodate the access time required by the peripheral devices. A variable frequency microprocessor clock generator for this type of application is described in U.S. Pat. No. 4,819,164 issued to Branson.

A similar feature is incorporated in the Compaq DESKPRO 386/20 system in which an "auto" mode allows the processor to operate at full speed except during diskette operations when the speed is reduced. This system can also be operated at one of a number of predetermined frequencies to simulate other processor systems.

A particular incentive for providing a variable frequency clock signal to a microprocessor fabricated with CMOS or CHMOS architecture is that the power dissipation of such a device is proportional to the clock frequency. Therefore, in order to reduce the active system power, it is desirable to reduce the clock frequency to the processor to the maximum extent consistent with maintaining system performance objectives. Furthermore, it is desirable to stop the processor clock altogether if the processor would otherwise be in an idle state. The Harris 82C85 CMOS Static Clock Controller/Generator provides a clock signal that may be at the full frequency of an external oscillator, at a divide-by-256 frequency, or that may be stopped.

Prior art variable frequency clock generators will generally produce a "glitch" when dynamically switching between clock frequencies. At the frequency transition, a clock cycle of indeterminate duration is likely to be produced. If this clock period is less than a minimum value tolerated by the microprocessor, a system anomaly may occur.

One of the objectives of the present invention is to provide a variable frequency clock generator that may be dynamically switched between frequencies such that the duration of every clock cycle is at least as great as the clock cycle duration of the highest operating frequency.

SUMMARY OF THE INVENTION

The present invention implements a variable frequency clock generator that provides a clock signal for a microprocessor at a selectable one of a plurality of frequencies and that may be dynamically switched between any of the frequencies so that every cycle of the clock signal has a duration at least as great as the cycle duration of the highest frequency. A control interface circuit receives complementary input clock signals, frequency selection signals and a clock synchronizing signal. This circuit provides a clock set signal in response to receipt of the clock synchronizing signal and which is synchronized with the input clock signal.

A clock divider circuit divides the system master clock to provide a set of complementary clock signals, each of which is synchronous with the master clock. The clock divider circuit also receives the clock set signal and restarts each of the corresponding clock signals at a common phase. Thus, when switching between frequencies, a "short" cycle of the clock signal cannot occur.

A phase generator circuit receives the complementary clock signals and frequency selection signals and gates the pair of clock signals having the selected frequency to the processor clock input.

DETAILED DESCRIPTION OF THE INVENTION

In the following description, for purposes of explanation and not limitation, specific circuits, timing relationships, etc. are set forth in order to provide a thorough understanding of the present invention. However, it will be apparent to one skilled in the art that the present invention may be practiced in other embodiments that depart from these specific details. In other instances, detailed descriptions of well known aspects of microprocessor systems and digital circuits are omitted so as to not obscure the description of the present invention with unnecessary detail.

System Overview

The present invention is advantageously employed in a microprocessor design optimized for applications requiring low power consumption and compact size. Such applications particularly include small personal computers of the types commonly referred to as laptops and notebooks. One embodiment of such a microprocessor is briefly described below; however, it is to be understood that the present invention is not limited to this particular microprocessor design, and may be incorporated in virtually any processor design.

Figure 1:
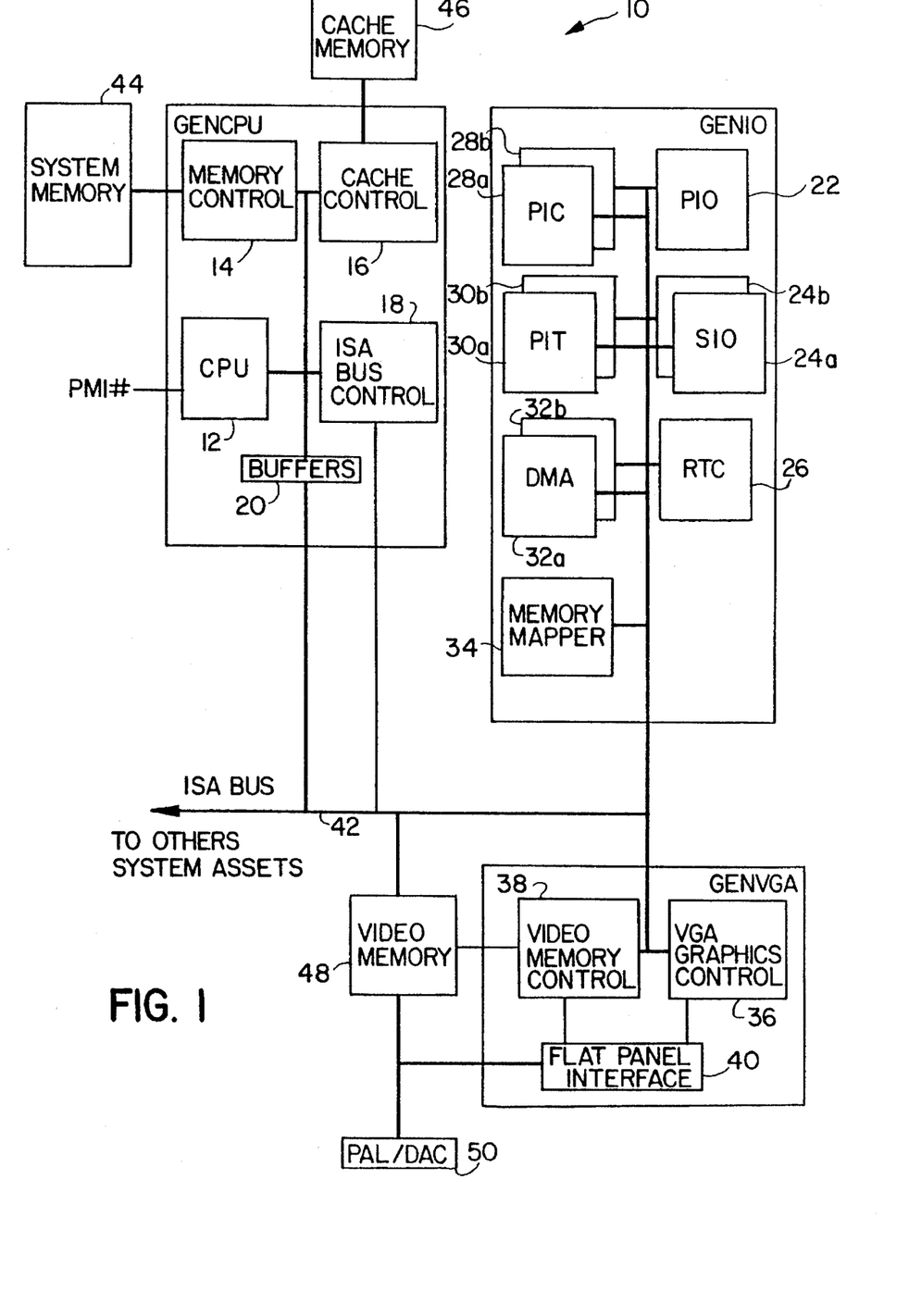
FIG. 1 is a functional block diagram of a microprocessor system embodying the present invention.

Referring to FIG. 1, a processor system 10 is shown. System 10 comprises three main processor components, designated as GENCPU, GENIO and GENVGA. GENCPU is an expanded central processing unit including the CPU 12, a memory controller 14, a cache controller 16, ISA bus control logic 18 and line buffers 20.

In the described embodiment, CPU 12 is essentially a 386™SX CPU manufactured by Intel Corporation, the corporate assignee of this invention. Throughout this description, certain terminology relating to the 386™SX CPU, such as register names, signal nomenclature, etc., is employed to describe the present invention. Such terminology is understood by practitioners in the field of microprocessor design and will therefore not be explained at length herein. For further information relating to the internal structure of CPU 12, reference is made to the "386™SX Microprocessor Hardware Reference Manual" published by Intel Corporation as publication number 240332 and related publications.

GENIO is a single chip input/output unit comprising parallel ports 22, dual serial ports 24a, 24b, real time clock unit 26, dual programmable interrupt controllers 28a, 28b, dual programmable timers 30a, 30b, dual DMA controllers 32a, 32b and memory mapper 34.

GENVGA is a single chip graphics interface comprising VGA graphics controller 36, video memory controller 38 and interface 40 for a flat panel display unit.

All of the processor units communicate with one another and with other system components (such as expansion slots, keyboard controller, disk controllers, etc.) via ISA bus 42.

External to the three main components of system 10 are system memory 44, optional cache memory 46 and optional video memory 48. An optional PAL/DAC unit 50 provides a video interface with a conventional VGA monitor.

CLOCK GENERATOR IMPLEMENTATION

Figure 2:
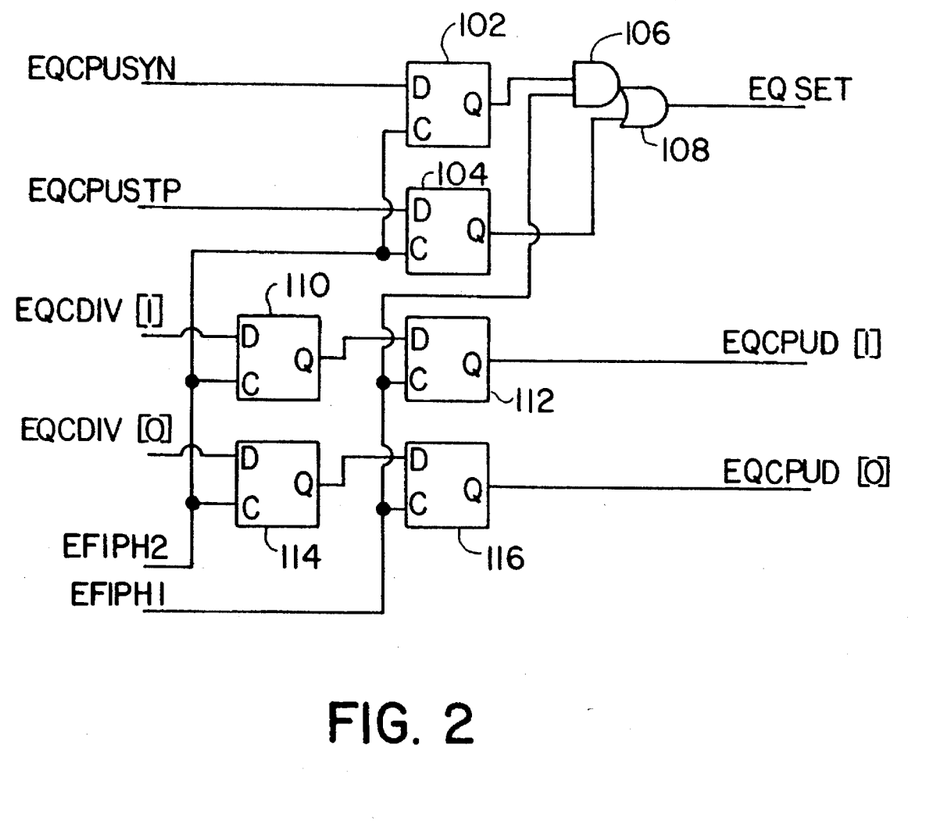
FIG. 2 is a schematic diagram of the control interface circuit of the present invention.

A schematic diagram of a clock generator circuit according to the present invention is shown in FIGS. 2–5. Referring first to FIG. 2, input signals EFIPH1 and EFIPH2 are non-overlapping phase 1 and phase 2 master clock signals, respectively, derived from the master clock input signal applied to CPU 12. Input signal EQCPUSYN is a positive going pulse with a duration equal to one cycle of the phase 1 master clock signal. This input signal synchronizes all CPU clock signals to the master clock and reinitializes the CPU clock signals during clock frequency transitions. Signal EQCPUSYN is applied to the input of D-type flip-flop 102. Flip-flop 102 is clocked by input EFIPH2 and provides the Q output to AND gate 106. AND gate 106 also receives as an input signal EFIPH1 and provides the output to OR gate 108.

Input signal EQCPUSTP is a command signal to stop all of the CPU clock signals. This input signal is synchronized with the phase 1 master clock signal EFIPH1. Input signal EQCPUSTP is applied to the input of D-type flip-flop 104. This flip-flop is also clocked by signal EFIPH2. The Q output of flip-flop 104 is applied as a second input to OR gate 108. The output of OR gate 108, signal EQSET, is a positive going pulse synchronous with the master clock for synchronizing all of the CPU clock signals as will be further described below.

Input signals EQCDIV[0] and EQCDIV[1] are frequency select signals for selecting one of the various CPU clock signals developed by the clock divider circuit of the present invention. A change of state of either of these input signals is accompanied by an EQCPUSYN pulse. Input EQCDIV[0] is applied to the input of D-type flip-flop 114 which is clocked by signal EFIPH2. The Q output of flip-flop 114 is applied to the input of D-type flip-flop 116 which is clocked by signal EFIPH1. The Q output of flip-flop 116, signal EQCPUD[0], is delayed from input EQCDIV[0] to compensate for the delay in developing signal EQSET. In a similar fashion, input signal EQCDIV[1] is delayed through D-type flip-flops 110 and 112 to develop signal EQCPUD[1].

Figure 3:
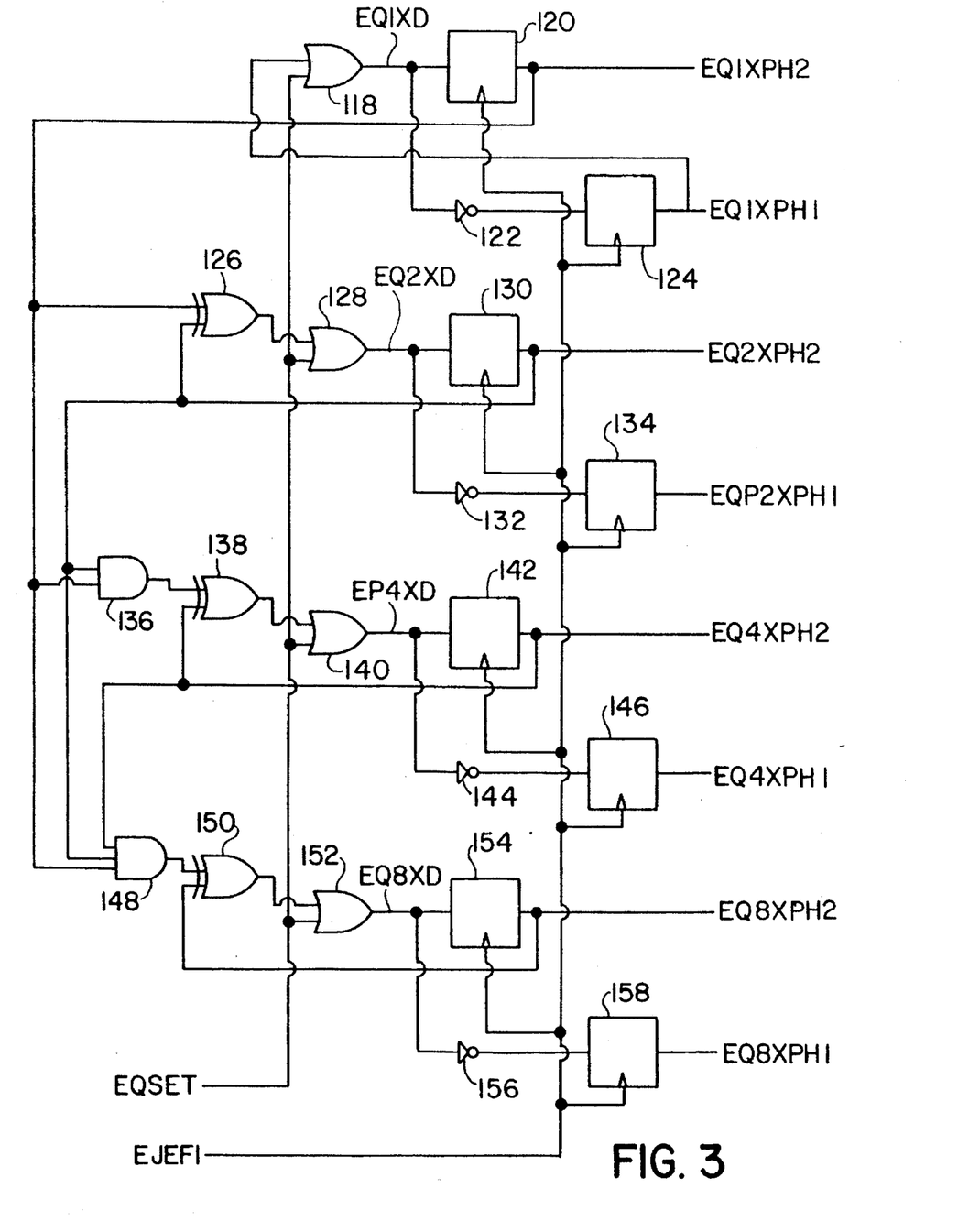
FIG. 3 is a schematic diagram of the clock divider circuit of the present invention.

Referring now to FIG. 3, the clock divider circuitry of the present invention is shown. This circuit is basically a counter circuit for developing complementary phase clock signals with a set input to force all phase 1 clock outputs low and all phase 2 clock outputs high. Signal EQSET is applied to an input of OR gate 118. A second input to OR gate 118 is applied from the output of master-slave flip-flop 124. The output of OR gate 118 is applied to the input of flip-flop 120. The gate inputs of flip-flops 120 and 124 are coupled to input signal EJEFI which is the master clock to CPU 12. The output of OR gate 118 is also applied to inverter 122, the output of which is applied to the input of flip-flop 124. The outputs of flip-flops 120 and 124, signals EQ1XPH2 and EQ1XPH1, respectively, therefore comprise complementary phase clock signals at one-half the frequency of input EJEFI and which are 180 degrees out of phase with each other.

Signal EQ1XPH2 is applied to an input of exclusive OR gate 126, the other input of which is provided as feedback from the output of flip-flop 130. The output of XOR gate 126 is applied to an input of OR gate 128, the other input of which is supplied by input signal EQSET. The output of OR gate 128 is applied to the input of flip-flop 130 which is gated by input EJEFI to develop output signal EQ2XPH2, a phase clock signal at half the frequency of signal EQ1XPH2 and one-quarter the frequency of EJEFI. Complementary phase clock signal EQ2XPH1 is developed at the output of flip-flop 134 which receives its input from the output of OR gate 128 through inverter 132.

Signals EQ1XPH2 and EQ2XPH2 are applied as inputs to AND gate 136, the output of which is applied as an input to exclusive OR gate 138. The other input of XOR gate 138 is fed back from the output of flip-flop 142. The output of XOR gate 138 is applied as an input to OR gate 140 which also receives signal EQSET as an input. The output of OR gate 140 is applied to the input of flip-flop 142 which is gated by signal EJEFI to develop output phase clock signal EQ4XPH2 at one-half the frequency of EQ2XPH2 or one-eighth the frequency of EJEFI. The complementary phase clock signal EQ4XPH1 is developed at the output of flip-flop 146 which receives its input from the output of OR gate 140 through inverter 144.

Signals EQ1XPH2, EQ2XPH2 and EQ4XPH2 are applied as inputs to AND gate 148. In like manner to the circuit stages previously described, the output of AND gate 148 is applied to exclusive OR gate 150, the output of which is applied to OR gate 152. The output of OR gate 152 is applied to the input of flip-flop 154 which is gated by EJEFI to develop output clock signal EQSXPH2 at one-sixteenth the frequency of EJEFI. Complementary phase clock signal EQSXPH1 is developed at the output of flip-flop 158 which receives its input from OR gate 152 through inverter 156.

The circuitry illustrated in FIG. 3 thus develops pairs of complementary phase clock signals at frequency sub-multiples of the master clock signal EJEFI.

Figure 4:
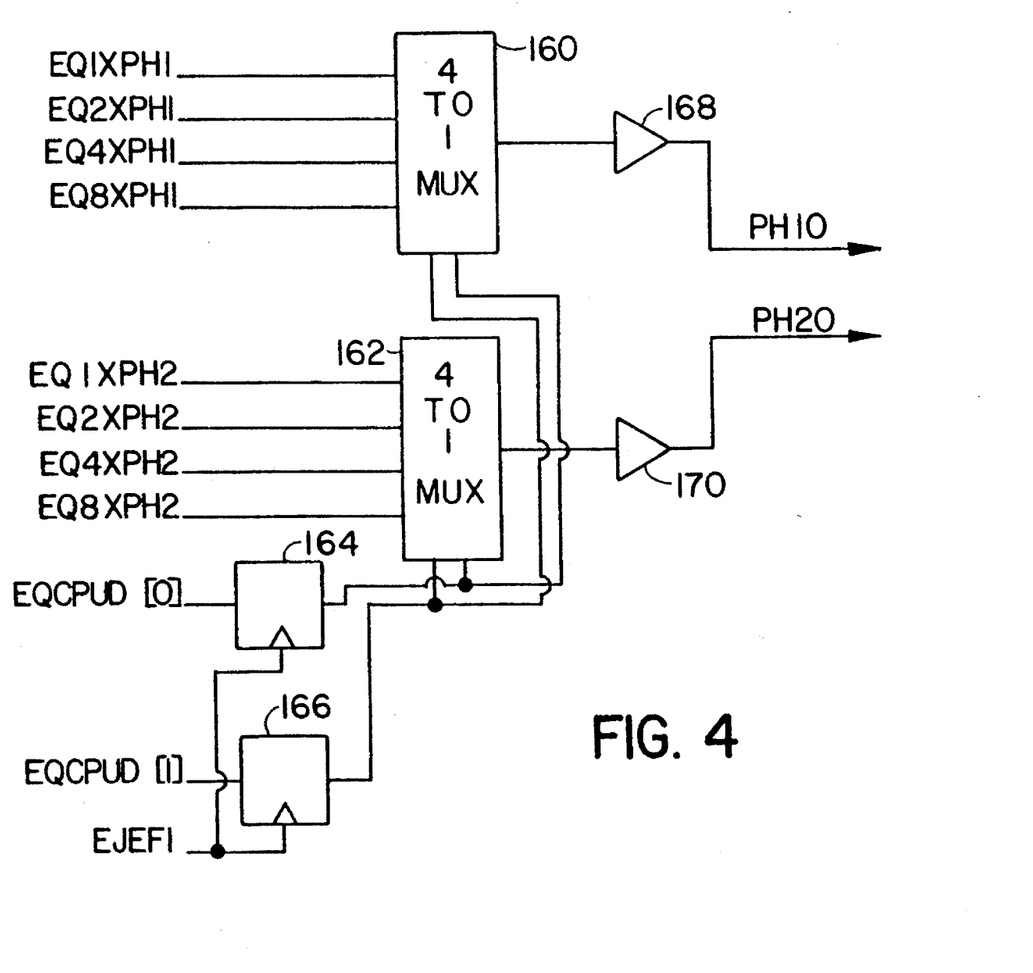
FIG. 4 is a schematic diagram of the phase clock generator circuit of the present invention.

Referring now to FIG. 4, phase 1 clock signals EQ1XPH1, EQ2XPH1, EQ4XPH1 and EQSXPH1 are applied to the inputs of multiplexer 160. In identical fashion, the phase 2 clock signals EQ1XPH2, EQ2XPH2, EQ4XPH2 and EQSXPH2 are applied to the inputs of multiplexer 162. The select lines of multiplexers 160 and 162 are driven from the outputs of flip-flops 164 and 166. These flip-flops receive signals EQCPUD[0] and EQCPUD[1], respectively, as inputs and are gated by master clock signal EJEFI. The outputs of multiplexers 160 and 162, buffered through gates 168 and 170, respectively, are the CPU phase 1 clock signal PH10 and the CPU phase 2 clock signal PH20. These signals are applied to buffers (not shown) which guarantee that the complementary phase clock signals as provided to the CPU do not overlap.

Since signal EQCPUSYN is always presented whenever a change in clock speed is commanded, thereby forcing all phase 1 clock outputs of the clock divider circuit to be driven low and all phase 2 clock outputs to be driven high, frequency transitions of the PH10 and PH20 complementary phase clock signals occur without the glitches that plague prior art variable frequency clock generators. The outputs of multiplexers 160 and 162 are selected when all inputs are in the same state, i.e., all inputs to multiplexer 160 are in the low state and all inputs to multiplexer 162 are in the high state.

It will be observed that in order to synchronize the CPU phase clock signals PH10 and PH20 to the EFI phase master clock signals EFIPH1 and EFIPH2, all that is required is to pulse the input signal EQCPUSYN for one EFI phase 1 clock period. To stop the CPU phase clock signals, the CPU phase clock speed is first set to EFI/4 (EQCDIV[1]=low and EQCDIV[0]=high). Signal EQCPUSYN is then pulsed for one EFI phase 1 clock period and input signal EQCPUSTP is held active. All phase 1 clock signals are thus held low and all phase 2 clock signals held high. The CPU phase clocks are restarted by removing the EQCPUSTP signal, returning the clock speed selection signals EQCDIV[0] and EQCDIV[1] to the desired values, and applying a one EFI phase 1 clock EQCPUSYN pulse.

Figure 5:
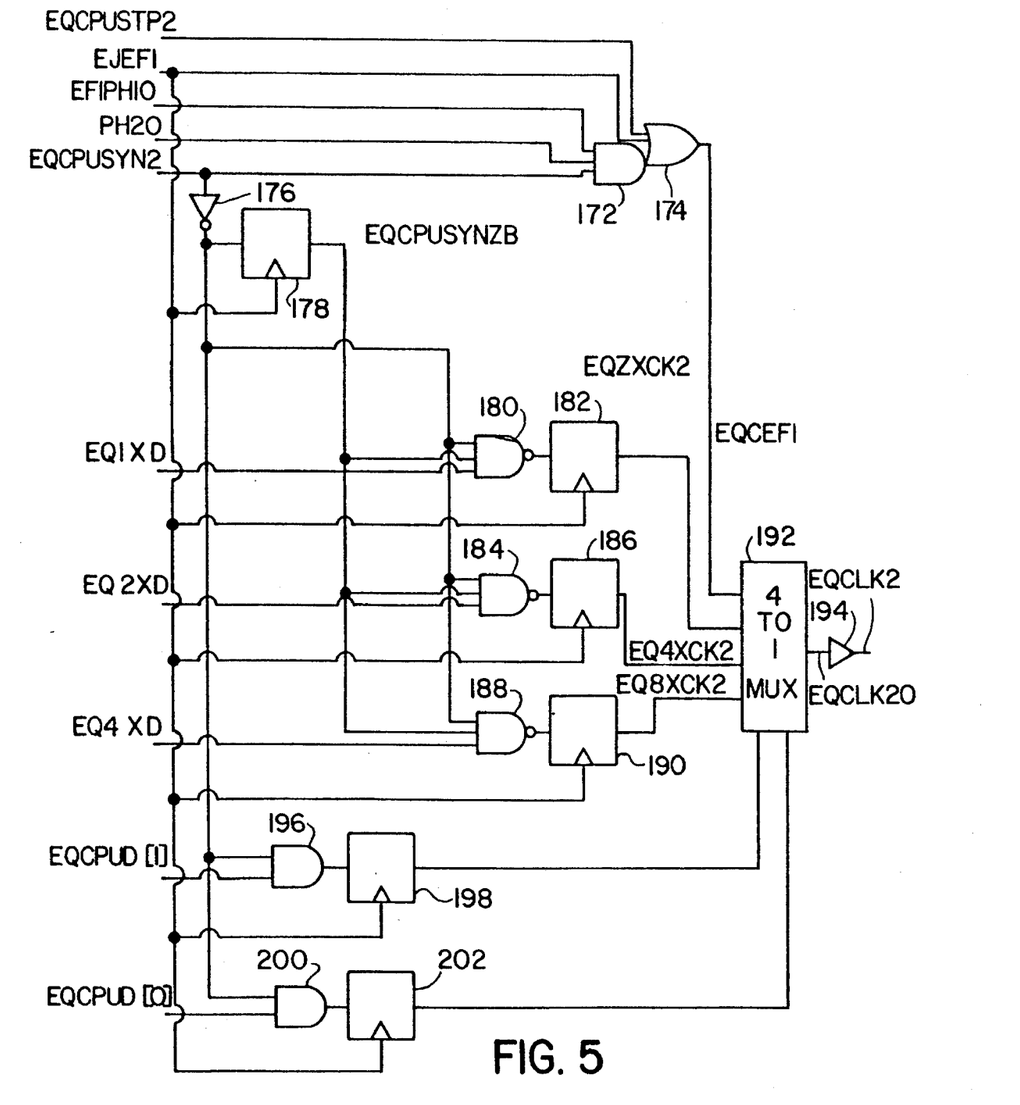
FIG. 5 is a schematic diagram of the full frequency clock generator circuit of the present invention.

FIG. 5 illustrates a circuit for generating a full frequency CPU clock signal. It is to be understood that the CPU phase clock signals, whose generation has been described above in connection with FIGS. 2–4, are at one-half the frequency of the full frequency clock. A full frequency clock signal corresponding to the CPU phase clock signals is essential for diagnostic purposes. The full frequency clock signal is generated in a manner similar to that used to generate the CPU phase clock signals.

Referring to FIG. 5, input signal EQCPUSTP2 corresponds to input signal EQCPUSTP described above, but is delayed with respect thereto by input clock signal EFIPH2. Similarly, input signal EQCPUSYN2 corresponds to input signal EQCPUSYN, but delayed with respect thereto by input signal EFIPH2. Input signal EFIPH10 is an early out version of input signal EFIPH1 described above. Signals EFIPH10, PH20 (from buffer 170 of the phase clock generator circuit) and EQCPUSYN2 are applied to the inputs of AND gate 172. The output of AND gate 172, together with input signals EQCPUSTP2 and EJEFI are applied as inputs to OR gate 174. The output of OR gate 174, signal EQCEFI, is normally the full frequency clock signal EJEFI, but is maintained in a high state by the synchronization pulse when a clock frequency switch is commanded.

Input EQCPUSYN2 is applied to inverter 176, the output of which is applied to the input of flip-flop 178. Flip-flop 178 is gated by signal EJEFI to provide delayed synchronization signal EQCPUSYN2B. This signal is applied as an input to each of NAND gates 180, 184 and 188. Each of these gates also receive the output of inverter 176 as an input. The signals EQ1XD, EQ2XD and EQ4XD from the clock divider circuit of FIG. 3 are applied as inputs to NAND gates 180, 184 and 188, respectively. The outputs of these gates are applied to flip-flops 182, 186 and 190, respectively, each of which is gated by input signal EJEFI. Signal EQCEFI and the outputs of flip-flops 182, 186 and 190 are applied to the inputs of multiplexer 192. It will be recognized that these four signals are the full frequency clock signals corresponding to the phase clock signals that are applied as inputs to multiplexers 160 and 162 as shown in FIG. 4.

Frequency selection signals EQCPUD[0] and EQCPUD[1] from the control interface circuit shown in FIG. 2 are applied to AND gates 200 and 196, respectively. Each of these gates also receives the output of inverter 176 as an input. The outputs of AND gates 196 and 200 are applied to flip-flops 198 and 202, respectively, both of which are gated by input signal EJEFI. The outputs of flip-flops 198 and 202 are applied to the line selection inputs of multiplexer 192 to select the appropriate full frequency clock signal which is then applied to buffer 194. The output of buffer 194, signal EQCLK2 is a full frequency clock signal functionally equivalent to a master clock signal from which CPU phase clock signals PH10 and PH20 would otherwise be derived in a conventional 386™SX processor.

Figure 6:
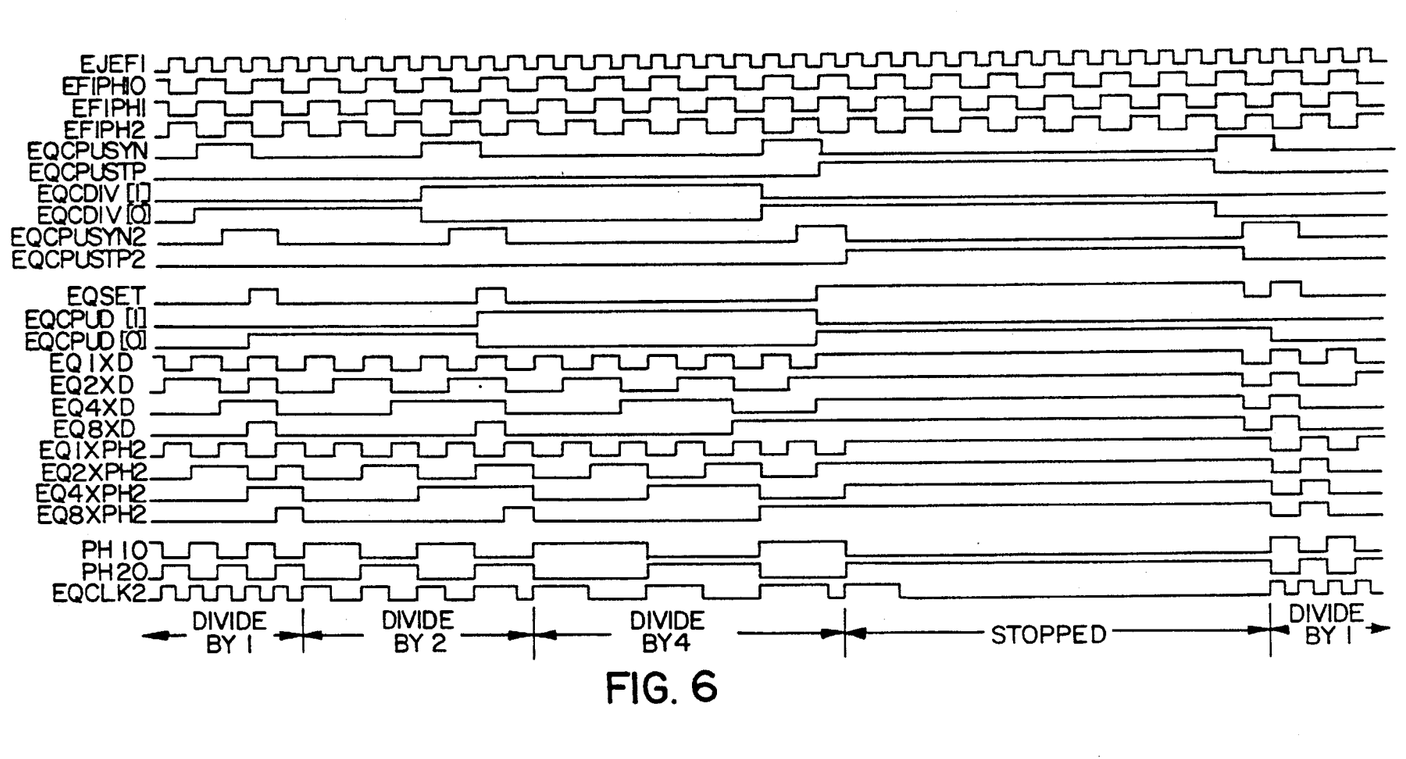
FIG. 6 is a timing diagram illustrating operation of the present invention.

FIG. 6 presents a timing diagram that illustrates operation of the present invention when switching the phase clock frequency from divide-by-one to divide-by-two, from divide-by-two to divide-by-four, from divide-by-four to a stopped clock mode, and from stopped back to divide-by-one. It should be particularly observed that all phase clock signals are restarted by the EQCPUSYN pulse prior to each frequency transition, thereby insuring that signals PH10 and PH20 are free of short cycle "glitches" at each of the transitions.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. An apparatus for providing a cyclic CPU clock signal for a microprocessor at a selectable one of a plurality of frequencies and for dynamically switching between any of said plurality of frequencies, wherein said apparatus comprises:

a) means for receiving a master clock signal;

b) control interface means for generating a clock set signal synchronous with said master clock signal;

c) clock divider means, operatively coupled to said master clock signal and said control interface means to receive said clock set signal, for generating a plurality of clock signals, each at a respective one of said plurality of frequencies that are submultiples of the master clock signal, said clock divider means including means responsive to said clock set signal for forcing all of said plurality of clock signals to a common state and to thereupon restart in said common state synchronous with said master clock signal;

d) multiplexing means operatively coupled to said clock divider means for selecting as said CPU clock signal one of said plurality of clock signals after said plurality of clock signals are restarted such that Said CPU clock signal is dynamically switched between said plurality of frequencies in synchronism with said master clock signal and such that every cycle of said CPU clock signal has a cycle duration at least as great as the cycle duration of a highest of said plurality of frequencies.

2. The apparatus of claim 1 wherein said control interface means includes clock inhibit means responsive to a clock stop signal for causing said clock set signal to be held in a logic state that stops said CPU clock signal.

3. The apparatus of claim 1 wherein said cyclic CPU clock signal is a first CPU clock signal and further comprising means for generating a second CPU clock signal that is a complement of the first CPU clock signal.

4. A method of providing a cyclic CPU clock signal for a microprocessor at a selectable one of a plurality of frequencies and for dynamically switching between any of said plurality of frequencies, wherein said method comprises the steps of:

a) receiving a master clock signal;

b) generating a clock set signal synchronous with said master clock signal;

c) generating a plurality of clock signals at said plurality of frequencies that are submultiples of said master clock signal;

d) forcing all of said plurality of clock signals to a common state in response to said clock set signal and concurrently restarting all of said plurality of clock signals in said common state synchronous with said master clock signal;

e) selecting as said CPU clock signal one of said plurality of clock signals after said plurality of clock signals are restarted such that said CPU clock signal is dynamically switched between said plurality of frequencies in synchronism with said master clock signal and such that every cycle of said CPU clock signal has a cycle duration at least as great as the cycle duration of a highest of said plurality of frequencies.

5. The method of claim 4 wherein said cyclic CPU clock signal is a first CPU clock signal and further comprising means for generating a second CPU clock Signal that is a complement of the first CPU clock signal.

* * * * *